(12) United States Patent
Okajima

(10) Patent No.: US 7,247,817 B2
(45) Date of Patent: Jul. 24, 2007

(54) CERAMIC HEATER HAVING A RESISTANCE HEATER ELEMENT

(75) Inventor: Hisakazu Okajima, Aichi-ken (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/657,806

(22) Filed: Sep. 8, 2003

(65) Prior Publication Data

US 2004/0108308 A1  Jun. 10, 2004

(30) Foreign Application Priority Data

Sep. 13, 2002 (JP) ............................ P2002-269085

(51) Int. Cl.
*H05B 3/68* (2006.01)
*H05B 3/02* (2006.01)

(52) U.S. Cl. .................... 219/444.1; 219/546

(58) Field of Classification Search ............ 219/443.1, 219/444.1, 465.1, 466.1, 543, 546, 547, 548; 118/724, 725; 338/283, 300, 299, 304, 308
See application file for complete search history.

(56) References Cited

U.S. PATENT DOCUMENTS 3,067,315 A * 12/1962 Hurko ..................... 219/543
5,766,363 A * 6/1998 Mizuno et al. ............ 118/725
6,080,970 A * 6/2000 Yoshida et al. .......... 219/444.1
6,242,719 B1 * 6/2001 Kano et al. .............. 219/444.1
6,753,507 B2 * 6/2004 Fure et al. ............... 219/444.1

FOREIGN PATENT DOCUMENTS

JP          07-065935 A       3/1995

* cited by examiner

Primary Examiner—Sang Paik
(74) Attorney, Agent, or Firm—Burr & Brown

(57) ABSTRACT

A heater is provided including a plate having a heating surface for heating an object to be heated and a resistance heater element provided in the plate. This resistance heater element includes a continuous wiring pattern including a plurality of flexures and a thermal uniform pattern part which improves thermal uniformity. The continuous wiring pattern includes a plurality of folding parts as the flexures. A first distance between the wirings in a first region of the wiring pattern other than a second region proximate the folding parts is substantially constant, and a second distance between the wirings in the second region is greater than the first distance.

14 Claims, 8 Drawing Sheets

CERAMIC HEATER HAVING A RESISTANCE HEATER ELEMENT

CROSS-REFERENCE TO RELATED APPLICATION

This application is based upon and claims the benefit of priority from prior Japanese Patent Application No. 2002-269085, filed on Sep. 13, 2002; the entire contents of which are incorporated herein by reference.

BACKGROUND OF THE INVENTION

1. Field of the Invention

The present invention relates to a heater used for heating an object to be heated such as a semiconductor wafer and a liquid crystal substrate, the heater being installed mainly in a chamber of a semiconductor manufacturing apparatus such as a CVD apparatus, a PVD apparatus and an etching apparatus.

2. Description of the Related Art

A heater installed in a CVD apparatus, an etching apparatus or the like heats an object to be heated such as a semiconductor wafer which is subjected to predetermined processing in these apparatuses.

FIG. 1 is a plan view of a conventional heater 1. A resistant heater element 3 is buried in a disk-shaped plate 2. The resistant heater element 3 is disposed therein so as to have a concentric circular wiring pattern taking a center portion of the plate 2 as its center.

Terminals 4 and 5 which perform input/output of electric power to/from the resistant heater element 3 are located in the center portion of the plate 2. The wiring pattern of the resistant heater element 3 is provided so as to be axisymmetric on the right and left sides of a center line of the plate 2. This wiring pattern has a plurality of arc parts 3a at symmetrical positions, the arc parts having different diameters from each other and equal intervals therebetween. In addition, radially adjacent arc parts 3a are connected with each other by use of a linear connection part 3b along a diameter direction of the plate 2. Both ends of the connection part 3b are corner parts 3c1 and 3c2, and the connection part 3b and the both corner parts 3c1 and 3c2 constitute a folding part.

The resistant heater element 3 is disposed to form a concentric circle in a continuous manner from one terminal 4 to the other terminal 5 by being folded more than once at a plurality of folding parts.

Moreover, in the case of using the heater with a lift pin which pushes up the object to be heated, through-holes 6 of the lift pin are formed at appropriate positions in the plate 2. In this case, the resistant heater element 3 is disposed so as not to cross the through-holes 6. For each of the through-holes 6, a small arc part 7 having a small radius of curvature is formed in the arc part 3a which is outside of and adjacent to the through-hole 6. The small arc part 7 is formed so as to be curved radially.

In such a heater 1 as described above, electric power is supplied to the resistant heater element 3 by connecting the terminals 4 and 5 to a power source and thus the resistant heater element 3 generates heat. The resistant heater element 3 has the concentric circular pattern approximately covering the plate 2. Thus, the plate 2 is heated by the generated heat and the object to be heated placed on the plate 2 is heated.

FIG. 2 shows only disposition of a resistant heater element 11 in another conventional heater, and a plate is omitted in the drawing. In this resistant heater element 11, a plurality of element lines, each of which has terminals on both ends thereof, are concentrically disposed and thus a concentric circular wiring pattern is formed as a whole. The resistant heater element 11 is configured by the concentric circular wiring of the plurality of element lines which are separated by the terminals.

For example, in FIG. 2, the wiring pattern includes an inner element line 12 and an outer element line 13, as shown in solid line. The respective element lines 12 and 13 have terminals 12a and 12b and 13a and 13b on their both ends, respectively. Therefore, power control is possible for each of the element lines 12 and 13. The terminals 12a, 12b, 13a and 13b are disposed in a concentrated manner at approximately the same positions across the wiring pattern in order to facilitate their connection with a power source. Thus, the terminals 12a, 12b, 13a and 13b are disposed so as to be close to each other.

Furthermore, in the respective element lines, flexures 14 and 15 which get between the terminals of the respective element lines are formed. Thus, each of the element lines is in a continuous state without being disconnected. For example, in the element line 12 including an inner arc part 12c and an outer arc part 12d, these arc parts 12c and 12d are connected with each other by use of the flexure 14 which passes between the terminals 12a and 12b. Thus, the element line 12 is continuous. Similarly, in the element line 13, an inner arc part 13c and an outer arc part 13d are connected with each other by use of the flexure 15 which passes between the terminals 13a and 13b. Thus, the element line 13 is continuous.

In this heater, such a disposition relationship as described above is continued radially inward and outward as shown by the dashed/double-dotted line. Thus, the entire resistant heater element 11 forms the concentric circular wiring pattern.

Note that, in the case of providing through-holes 6 in the plate, similarly to the heater shown in FIG. 1, small arc parts 7 are formed at peripheries of the through-holes 6 (in FIG. 2, the small arc parts 7 are formed in the element line 12). Thus, it is avoided that the small arc parts 7 cross the through-holes 6.

In the heater shown in FIG. 2, the electric power is supplied by connecting the respective terminals (for example, the terminals 12a, 12b, 13a and 13b) of the respective element lines (for example, the element lines 12 and 13) with the power source. Thus, the respective element lines generate heat. The resistant heater element 11 including the plurality of element lines has the concentric circular wiring pattern approximately covering the entire surface of the plate. Consequently, the plate is heated by the generated heat and an object to be heated contacting the plate 2 is heated.

In the heater 1 shown in FIGS. 1 and 2, the resistant heater elements 3 and 11 have the concentric circular wiring pattern approximately covering the entire surface of the plate. Thus, it has been considered that the entire heating surface of the plate can be evenly heated. However, in reality, it has become apparent that a cool spot with a lower temperature than other parts and a hot spot with a higher temperature than the other parts locally occur, causing a variation in a temperature distribution, and thus it making difficult to obtain a certain thermal uniformity.

As a result of the in-depth examination by the inventors regarding the above-described problem, it was found out that the problem has causes shown in FIGS. 3 to 5.

Specifically, FIG. 3 shows the folding part of the resistant heater element 3 in FIG. 1, in which the inner and outer arc parts 3a are connected by the folding part including the both corner parts 3c1 and 3c2 and the connection part 3b. Here, a width L2 (a space between the corner parts 3c1 and 3c2) of the folding part connecting the two arc parts 3a is approximately the same as a general width L1 of the connected arc parts 3a, that is, a space between the two connected arc parts 3a. Thus, in heating the plate 2 by allowing the resistant heater element 3 to generate heat, a region surrounded by four folding parts (an area indicated by cross-hatching in FIG. 3) is far away from any part of the resistant heater element. Consequently, the region becomes a cool spot 20 having a lower temperature than its surrounding.

FIG. 4 shows an area where the through-hole 6 is provided in the plate. In this area, the small arc part 7 is formed, which is curved radially outward. Thus, the small arc part 7 is in a state of being close to the arc part 3a positioned outside of the small arc part 7. In this way, an area where the small arc part 7 and the arc part 3a are close to each other (an area indicated by solid-hatching) has a large heat amount and becomes a hot spot 21 having a higher temperature than its surrounding.

FIG. 5 shows the flexures 14 and 15 shown in FIG. 2. The flexure 14 is provided between the terminals 12a and 12b and thus the inner and outer arc parts 12c and 12d of the element line 12 are connected to each other by the flexure 14. Meanwhile, the flexure 15 is provided between the terminals 13a and 13b and thus the inner and outer arc parts 13c and 13d of the element line 13 are connected to each other by the flexure 15. Therefore, predetermined heat generation is performed in an area connected by the flexures 14 and 15. However, areas between the flexure 14 and the terminal 12a (or the terminal 12b), between the flexure 15 and the terminal 13a (or the terminal 13b) and between the flexures 14 and 15 have a small heat amount and become a cool spot 22 as shown by cross-hatching.

When the cool spots 20 and 22 and hot spot 21 as described above exist, the plate cannot heat the entire object to be heated uniformly and the object to be heated cannot be subjected to etching processing and film formation processing evenly.

SUMMARY OF THE INVENTION

It is an object of the present invention to provide a heater capable of heating the entire object to be heated uniformly while preventing a cool spot and a hot spot from occurring locally.

A heater according to a first aspect of the present invention includes a plate having a heating surface for heating an object to be heated; and a resistant heater element provided in the plate. This resistant heater element has a continuous wiring pattern with a plurality of flexures. Between one flexure and another flexure adjacent thereto, a thermal uniform pattern part that improves thermal uniformity is formed. Here, the thermal uniform pattern part is a wiring pattern that is provided in order to prevent the occurrence of hot spots or cool spots relative to the surrounding temperature.

According to the first aspect of the present invention, the uniform heat pattern part is formed between one flexure and another flexure adjacent thereto and thus a calorific value in the flexure of the resistant heater element becomes approximately the same as that of its surrounding. Consequently, the thermal uniformity is improved without the occurrence of local cool and hot spots.

A heater according to a second aspect of the present invention includes a plate having a heating surface for heating an object to be heated and a resistant heater element provided in the plate. This resistant heater element includes a continuous wiring pattern with a plurality of folding parts. A space between wirings before folding and after folding with respect to each of the folding parts is approximately the same as a width L3 in a region other than the folding part and the vicinity thereof and is made wider than the width L3 at the folding part and in the vicinity thereof.

According to the second aspect of the present invention, the folding part of the element line is formed to be wider than the general part. Thus, the heat generated at the folding part can be spread to its surrounding. Consequently, occurrence of a cool spot in the vicinity of the folding part can be prevented and the thermal uniformity can be improved.

A heater according to a third aspect of the present invention includes a plate having a heating surface for heating an object to be heated, and at least one hole. The hole penetrates the heating surface in a vertical direction or has a depth in the heating surface. A resistant heater element that includes a continuous wiring pattern with a plurality of flexures is provided in the plate. Moreover, this wiring pattern includes multiple rows of wiring parts having curved portions for avoiding the holes around the holes. The radii of curvature in the curved portions of the multiple rows of wiring parts increase as the distance between the respective curved portions and holes increases.

According to the third aspect of the present invention, the radii of curvature of the avoidance parts become sequentially larger as the avoidance parts move away from the hole part. Thus, the heat amount in the avoidance parts is made to be the same as that of their surrounding. Consequently, a hot spot never occurs and thermal uniformity can be improved.

A heater according to a fourth aspect of the present invention includes a plate having a heating surface for heating an object to be heated and a resistant heater element provided in the plate. This resistant heater element includes a wiring pattern in which a plurality of element lines are concentrically disposed, the element lines having terminals for input/output of electric power. Each of the element lines has a winding pattern. One element line passes between the terminals by means of a flexure, and the flexure has a swollen part in an asymptotic direction to an adjacent portion of the adjacent same element line or another element line.

According to the fourth aspect of the present invention, the space between the flexure of the element line and the adjacent portion of the element line adjacent to the flexure becomes narrower due to the swollen part formed in the flexure. Thus, the heat generated thereby can prevent the occurrence of a cool spot and thermal uniformity can be improved.

DETAILED DESCRIPTION OF THE INVENTION

First Embodiment

Figure 1:
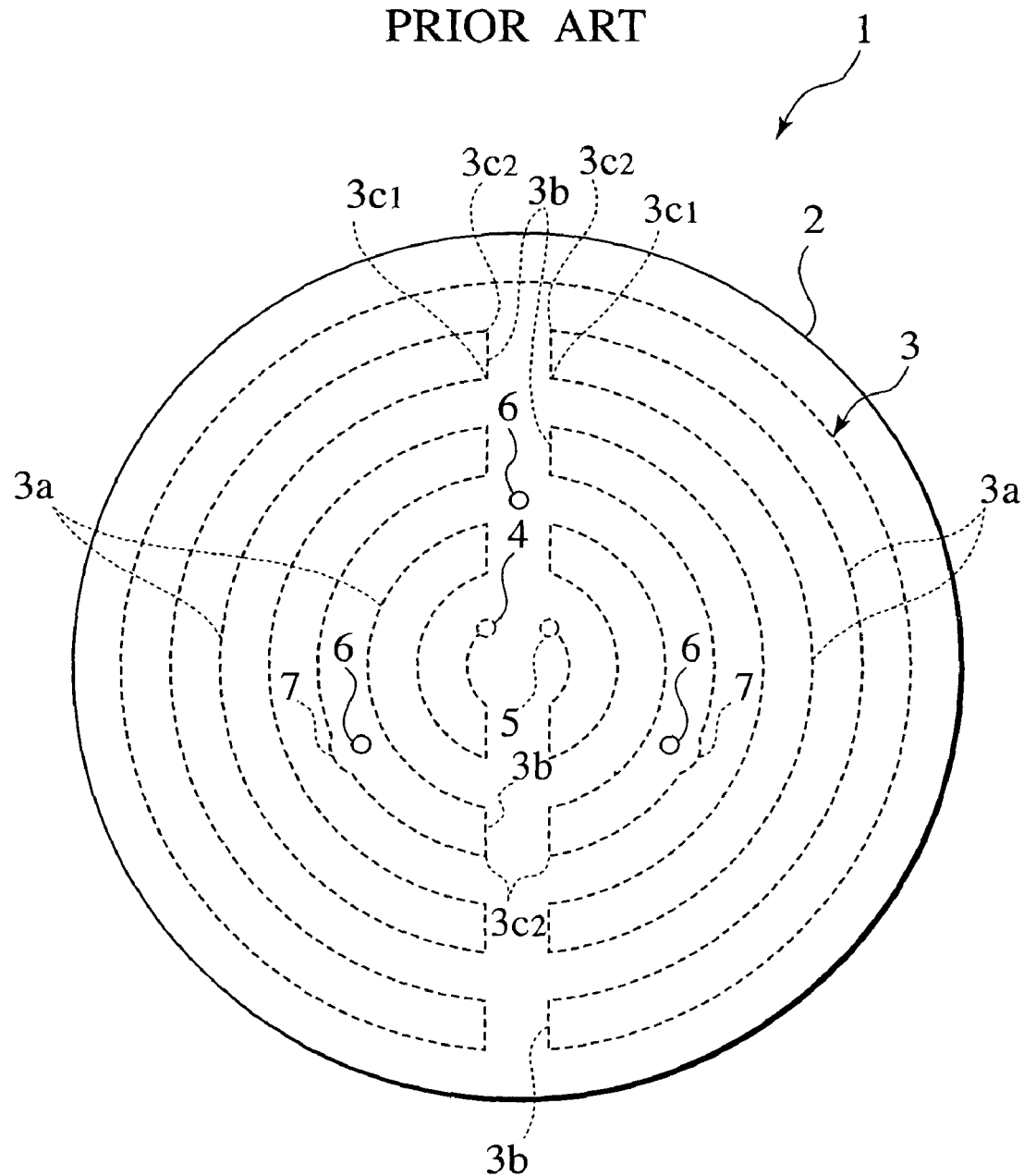
FIG. 1 is a plan view showing a conventional heater.
Figure 6A:
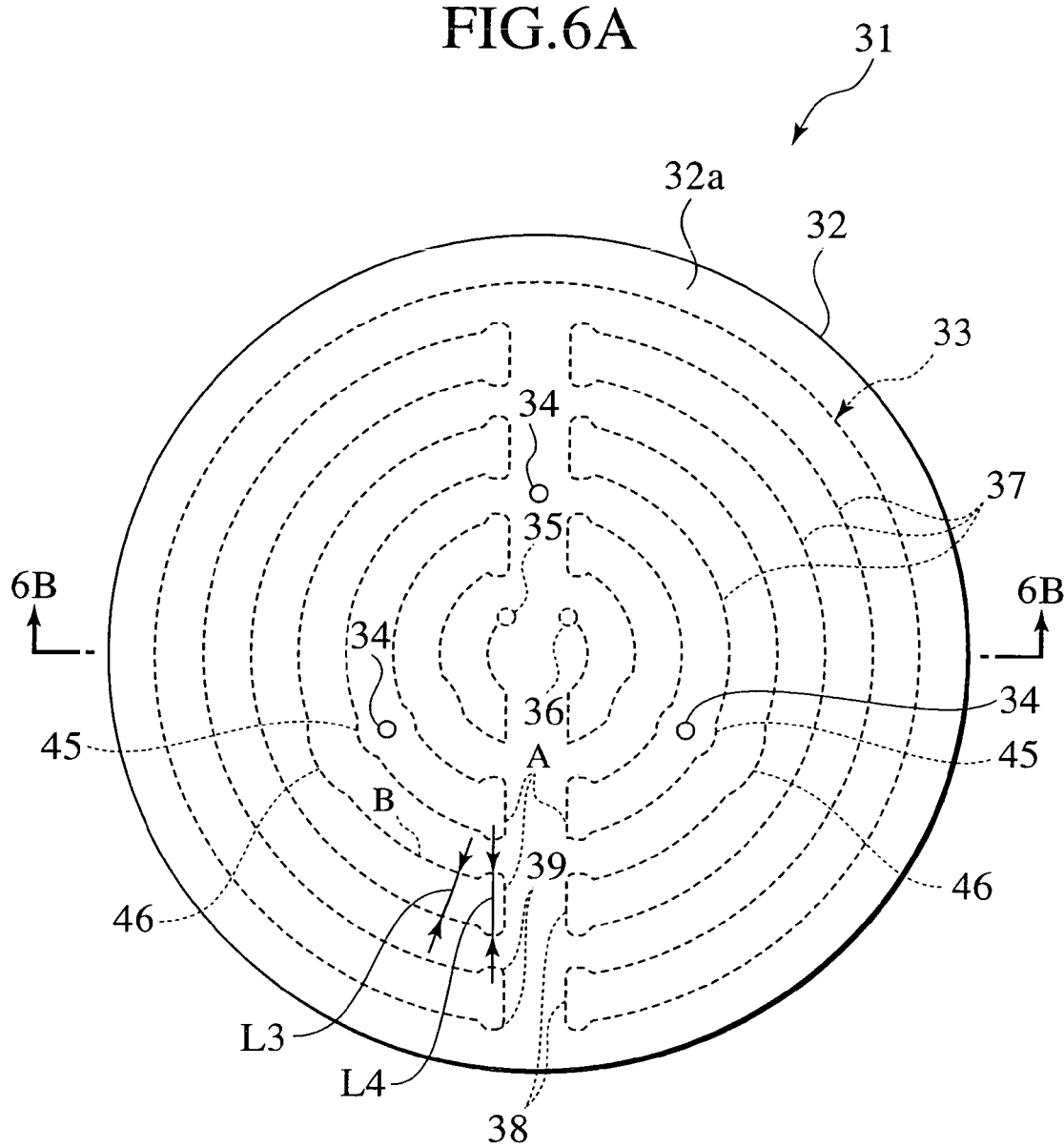
FIG. 6A is a plan view showing a heater according to a first embodiment of the present invention.
Figure 6B:
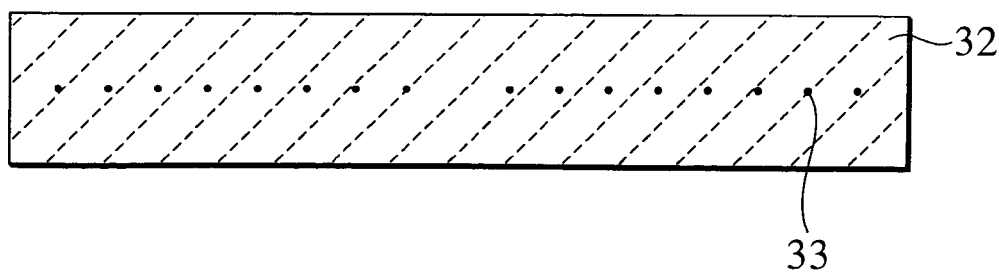
FIG. 6B is a cross-sectional view of FIG. 6A.

FIGS. 6A and 6B show a heater 31 according to a first embodiment. This heater 31 includes a plate 32 and a resistant heater element 33 embedded in the plate. A fundamental structure of the heater element 33 corresponds to the heater element 3 of the heater 1 shown in FIG. 1.

The whole plate 32 is formed in a disk shape and its upper surface contacts an object to be heated and serves as a heating surface 32a for heating the object to be heated. The hearing surface 32a is flat but may be formed to have a pocket shape having a concave portion contacting the object to be heated. The heating surface 32a may be embossed or processed to have unevenness such as grooves. Examples of the object to be heated include substrates such as a semiconductor wafer and a liquid crystal substrate. These substrates are placed on the heating surface 32a.

As a material of the plate 32, ceramics such as aluminum nitride, silicon nitride, silicon carbide and alumina can be used. This plate 32 is formed in a disk shape having a predetermined radius and a predetermined thickness. The radius of the plate 32 is selected in accordance with a radius of the object to be heated. When the object to be heated is a semiconductor wafer, the plate 32 is set to have a diameter of 200 to 300 mm, for example. The thickness of the plate 32 is set within a range in which the ceramics can be sintered and have a predetermined strength. When the object to be heated is a semiconductor wafer, the thickness of the plate 32 is set 10 to 20 mm.

In the plate 32, a plurality of through-holes 34 are formed, through which a lift pin pushing up the object to be heated penetrates. As shown in FIG. 6A, three of the through-holes 34, for example, are formed in a radially intermediate portion of the plate 32 so as to have even intervals from the center of the plate 32.

In the plate 32, a concave hole part for positioning the object to be heated may be formed. Furthermore, an element for a high frequency electrode, an electrode element for an electrostatic chuck and the like can be also embedded in the plate 32.

The resistant heater element 33 embedded in the plate 32 has a wiring pattern shown in FIG. 6A, which is formed by processing a linear, coil-shaped, ribbon-shaped, mesh-shaped, plate-shaped, or film shaped element.

Note that, the resistant heater element 33 may be provided on a surface of the plate 32 or on its reverse-side instead of being embedded therein. However, by being embedded in the plate 32, the resistant heater element 33 can be protected from oxidization, rusting and corrosion.

As a material of a resistant heater element used for the resistant heater element 33, molybdenum, tungsten and alloy of molybdenum and tungsten are preferably used. Besides the above, other high-resistance metal and a material containing high-resistance metal can be also used.

The resistant heater element 33 has terminals 35 and 36 for input/output of electric power. These terminals 35 and 36 are positioned in a center portion of the plate 32. By use of these terminals 35 and 36 as starting points, the resistant heater element 33 is disposed to be axisymmetric on the left and right sides of a center line of the plate 32.

Moreover, in the resistant heater element 33, a plurality of arc parts 37 are disposed radially at even intervals, the arc parts taking the terminals 35 and 36 as their starting points and having different diameters from each other. Thus, the resistant heater element 33 is disposed in the plate 32 so as to have a concentric wiring pattern. Furthermore, the adjacent arc parts 37 are connected to each other by connection parts 38 extending in the diameter direction. Both ends of each connection part 38 are corner parts 39. The connection part 38 and the both corner parts 39 and 39 constitute a folding part A. Specifically, the inner arc parts 37 are connected to the connection parts 38 by folding their terminal portions radially by use of the corner parts 39 and further connected to the outer arc parts 37 by folding terminal portions of the connection parts 38 in a circumferential direction by use of the corner parts 39. Accordingly, by being folded more than once at the plurality of the folding parts A, the entire resistant heater element 33 is formed to have the concentric wiring pattern in a continuous state. Thus, the terminals 35 and 36 are serially connected by the resistant heater element 33. Moreover, the concentric wiring pattern is disposed on approximately the entire surface of the plate 32. Note that, the folding part A is one embodiments of the flexure of this invention.

In the heater according to the first embodiment, the folding parts A are formed to be wider than a general part B that is in a region other than the folding parts A and the vicinity thereof and thus a thermal uniform pattern part is formed. Specifically, the distance between wirings before folding and after folding with respect to the folding part A is approximately L3 in the general part B and the distance between wirings is L4 in the folding part and the vicinity thereof. The width L4 is wider than width L3. Hereinafter, L4 indicates a width of the folding part.

Figure 7:
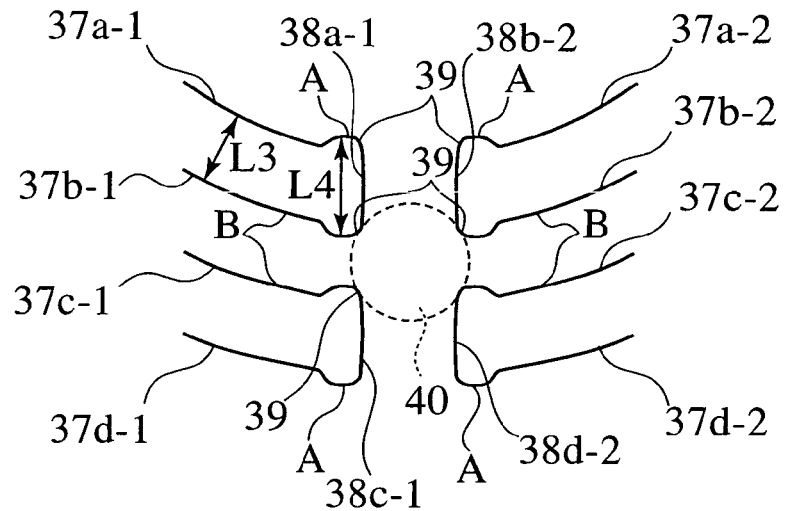
FIG. 7 is a partial plan view of the heater, showing a design example of a folding part of a resistant heater element according to the first embodiment of the present invention.

With reference to FIG. 7, a structure of this thermal uniform pattern part will be described more in detail below.

In FIG. 7, reference numerals 37a-1 and 37a-2 are arc parts in the same diameter portion and reference numerals 37b-1 and 37b-2 are arc parts in a diameter portion outside the above ones. The arc parts 37a-1 and 37b-1 are connected by a connection part 38a-1 in the diameter direction and the arc parts 37a-2 and 37b-2 are connected by a connection part 38b-2 in the diameter direction. Arc parts 37c-1, 37c-2, 37d-1 and 37d-2 are also in a disposition relationship similar to the above. The arc parts 37c-1 and 37d-1 are connected by a connection part 38c-1 in the diameter direction and the arc parts 37c-2 and 37d-2 are connected by a connection part 38d-2 in the diameter direction. These arc parts and connection parts are connected by use of approximately round swollen parts 39 which are formed at the corner parts and protrude outward.

With the structure as described above, the folding parts A include the connection parts connecting the arc parts adjacent in the diameter direction and the swollen parts 39 at the both ends thereof. For example, the connection part 38a-1 connecting the arc parts 37a-1 and 37b-1 has the swollen part 39 at its both ends and the connection part 38b-2 connecting the arc parts 37a-2 and 37b-2 has the swollen part 39 at its both ends. The relationship between the other arc parts and connection parts is similar to the above one.

As described above, in the folding part A of this embodiment, the round swollen parts 39 shown in FIG. 7 are formed at the corners of the ends of the connection part 38a-1 so as to obtain width L4 of the folding part. The width L4 is wider than the width L3, which is the distance between the arc parts 37a-1 and 37b-1 in general part B. That is, L4>L3.

By use of such a dimensional relationship, the swollen parts 39 of the folding parts A are in a state of being close to each other between the adjacent arc parts. For example, the swollen part 39 outside the connection part 38a-1 connecting the arc parts 37a-1 and 37b-1 and the swollen part 39 inside the connection part 38c-1 connecting the arc parts 37c-1 and 37d-1 are in the state of being close to each other. Accordingly, the resistant heater element generates heat in the state where the swollen parts 39 are close to each other. Thus, heat can be spread between the swollen parts 39. Specifically, the heat generated at the folding part A can be spread to its surrounding and thus good heat generation can be achieved in a surrounding area 40 surrounded by the swollen parts 39. Consequently, the occurrence of a cool spot can be prevented in this surrounding area 40. Therefore, thermal uniformity of the entire plate 32 can be improved.

As described above, the formation of the swollen parts 39 narrows the space between the adjacent swollen parts 39. Accordingly, the area including the four swollen parts 39 adjacent to each other can be made smaller than an area in the case of forming no swollen part 39. Thus, thermal uniformity can be improved. Consequently, in the case where the area can be made small, the swollen parts 39 are not always provided at the both ends of the connection part 38 but may be formed at one end thereof.

Figure 8A:
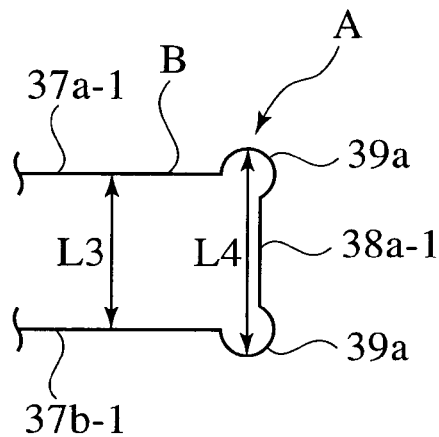
FIGS. 8A and 8B are plan views of a main part, showing other design examples of the folding part of the resistant heater element.
Figure 8B:
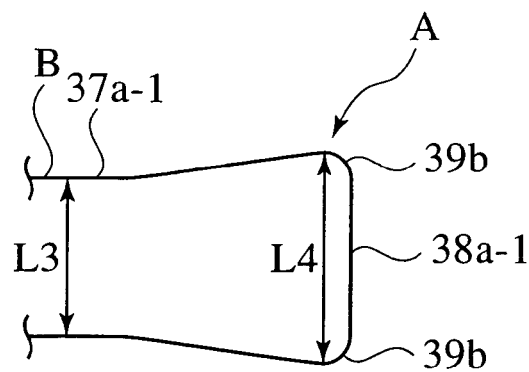

FIGS. 8A and 8B show modified examples of the swollen part 39. Specifically, as shown in FIG. 8A, a swollen part 39a is formed in an approximately round shape, which is swollen while protruding outward from the arc part 37a-1 (or 37b-1) and the connection part 38a-1. Meanwhile, the swollen part 39 shown in FIG. 7 is formed in an approximately round shape, which is swollen while protruding outward only from the arc part 37a-1, for example.

As shown in FIG. 8B, a swollen part 39b is formed as a tapered top portion, which becomes gradually wider from the general part B, for example, the arc part 37a-1 (or 37b-1). The formation of these swollen parts 39a and 39b can make the width L4 of the folding part A wider than the width L3 of the other general part B. Thus, it is possible to achieve operations and effects similar to those obtained by the swollen parts 39.

Figure 9:
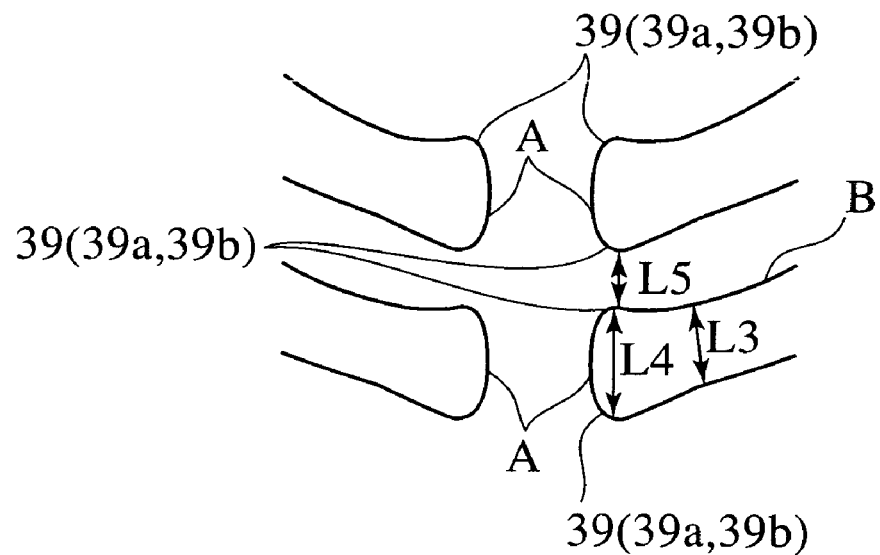
FIG. 9 is a plan view of a main part, showing a relationship between the folding part of the resistant heater element according to the first embodiment and its surrounding.

Moreover, as shown in FIG. 9, it is preferable that the width L4 of the folding part A is made wider so as to have a relationship of L4≧L3×1.1 with the width L3 of the general part B by forming the swollen parts 39 (39a or 39b).

In this event, 1 mm or more is secured for a space L5 between the folding parts A and A.

Here, in the resistant heater element 33 of this embodiment, an avoidance part as the thermal uniform pattern part is formed for the through-hole 34 as the hole part. The structure of this avoidance part will be described with reference to FIG. 10.

Figure 10:
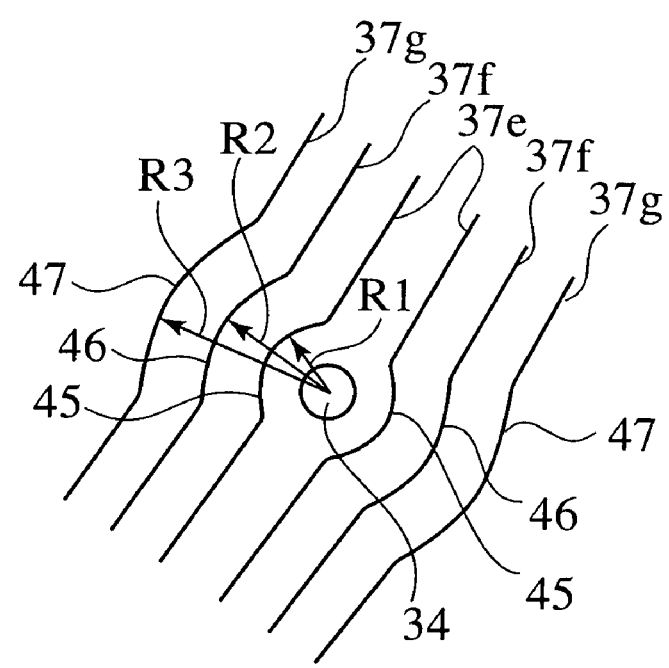
FIG. 10 is a partial plan view of the heater, showing a design example of an avoidance part of the resistant heater element according to the first embodiment.

In FIG. 10, arc parts 37e are closest to the through-hole 34, the arc parts 37f are positioned outside the arc part 37e and is second closest to the through-hole 34 after the arc part 37e and arc parts 37g are positioned outside the arc part 37f. In areas of these arc parts 37e to 37g, which correspond to the through-hole 34, avoidance parts 45 to 47 are formed and are curved in a direction away from the through-hole 34 to avoid the through-hole 3. These avoidance parts 45 to 47 are curved while having intervals similar to those of the arc parts 37e to 37g.

Furthermore, the avoidance parts 45 to 47 are set in such a manner that their radii of curvature sequentially increase for each subsequent avoidance part that is farther away from the through-hole 34. Specifically, when it is assumed that the radius of curvature of the avoidance part 45 is R1, the radius of curvature of the avoidance part 46 is R2 and the radius of curvature of the avoidance part 47 is R3, the avoidance parts are set to have a relationship of R1<R2<R3.

In such a manner, the radii of curvature R1 to R3 of the avoidance parts 45 to 47 are sequentially increased as the avoidance parts get away from the through-hole 34. Thus, without making the avoidance parts 45 to 47 close to each other, the heat amount in the avoidance parts 45 to 47 becomes approximately the same as that of the surrounding thereof. Accordingly, a hot area never occurs in the portion of forming the through-hole 34 and thermal uniformity of the entire plate 32 can be improved.

Second Embodiment

Figure 11:
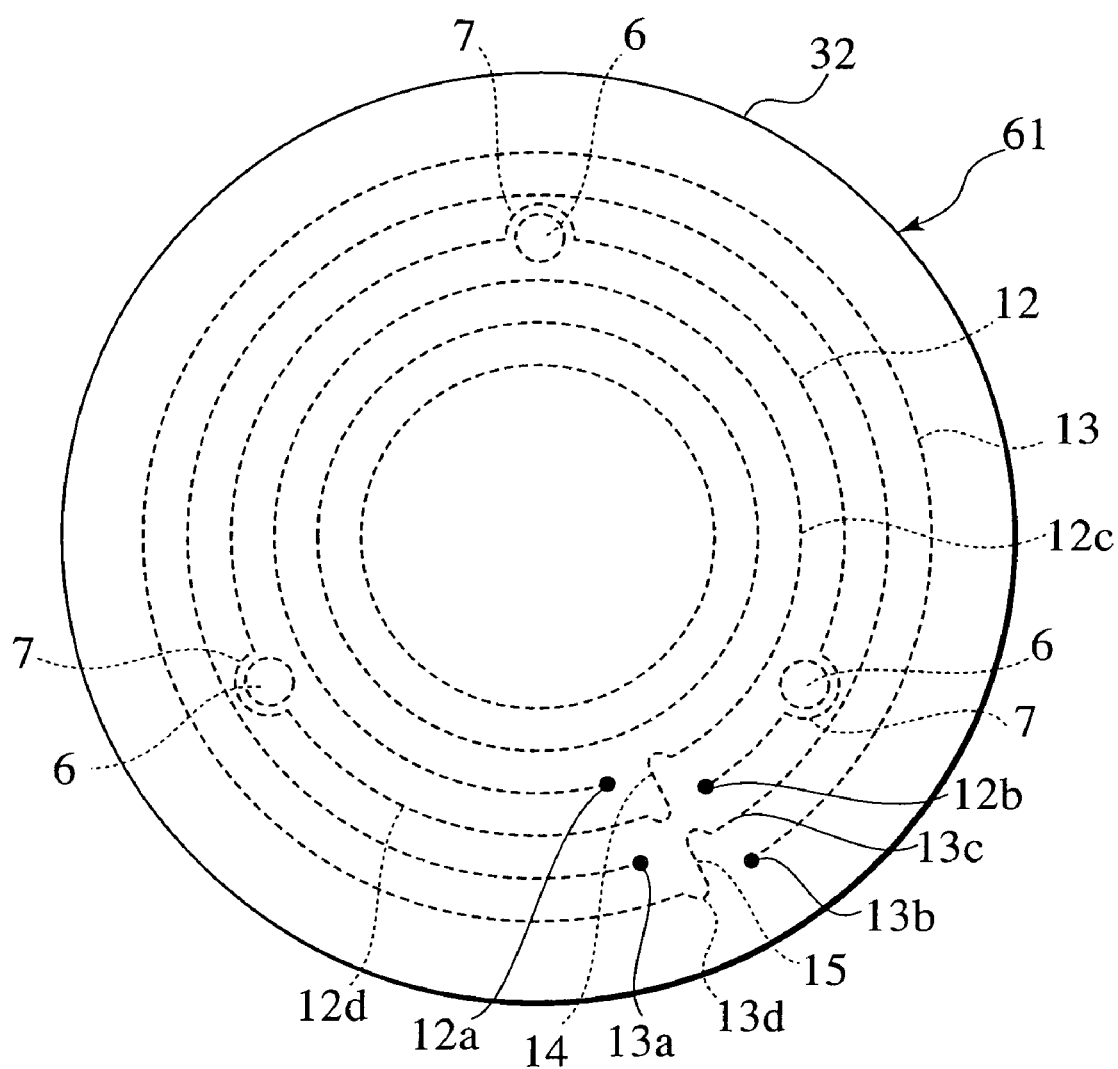
FIG. 11 is a plan view showing disposition of a resistant heater element of a heater according to a second embodiment of the present invention.

FIG. 11 is a view showing a structure of a resistant heater element of a heater according to a second embodiment. A fundamental structure of the heater is the same as that of the heater according to the first embodiment. The heater of this embodiment includes a plate 32 and resistant heater elements 12 and 13 embedded in the plate. A fundamental structure of the resistant heater element corresponds to that of the resistant heater element of the heater 1 shown in FIG. 2.

Figure 2:
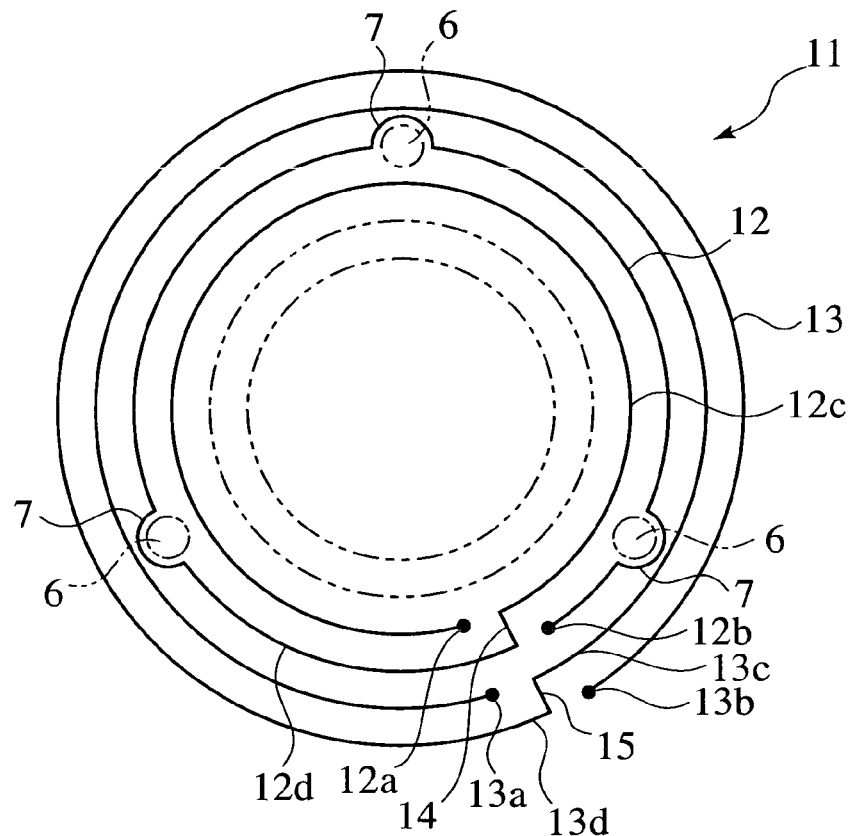
FIG. 2 is a plan view showing a wiring pattern of a conventional resistant heater element.
Figure 5:
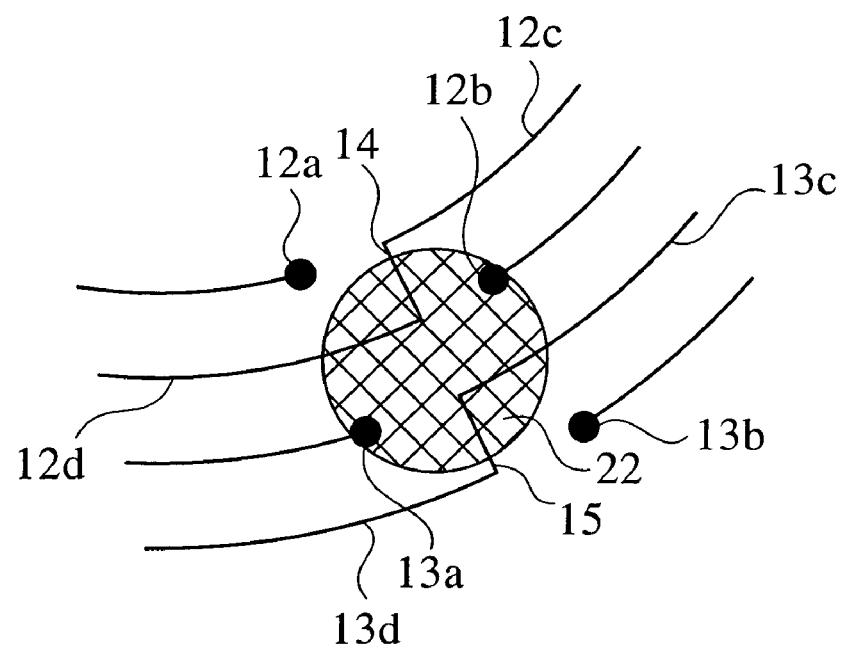
FIG. 5 is a partial plan view of a heater, showing a flexure of still another conventional resistant heater element.

In this heater, a thermal uniform pattern part is formed for a wiring pattern in which a plurality of element lines separated by use of terminals are disposed in concentric circles. Another configuration with the same structure is similar to that shown in FIGS. 2 and 5 and thus the same constituent components as those in FIGS. 2 and 5 are denoted by the same reference numerals.

The resistant heater element in the heater according to the second embodiment has a wiring pattern in which a plurality of element lines 12 (13) separated by use of terminals 12a and 12b (13a and 13b) for input/output of electric power are disposed. Each of the element lines has a winding pattern. Each element line has a spiral pattern. The element line passes between the terminals 12a and 12b (13a and 13b) by means of a flexure 15, and the flexure 15 has a swollen part in an asymptotic direction to an adjacent portion of the adjacent same element line or another element line.

Figure 12:
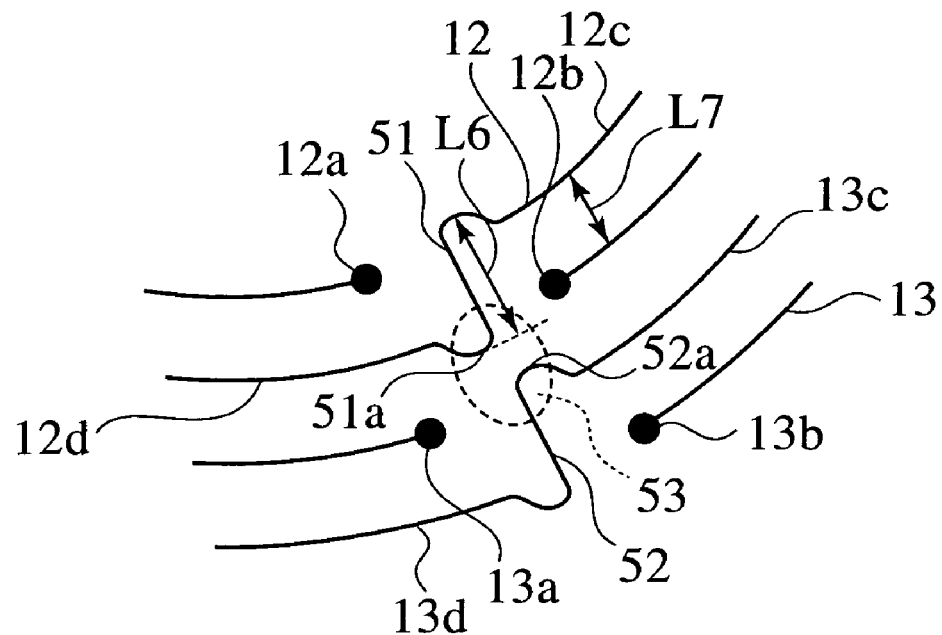
FIG. 12 is a partial plan view of the heater, showing a design example of a flexure of the resistant heater element according to the second embodiment.
Figure 13:
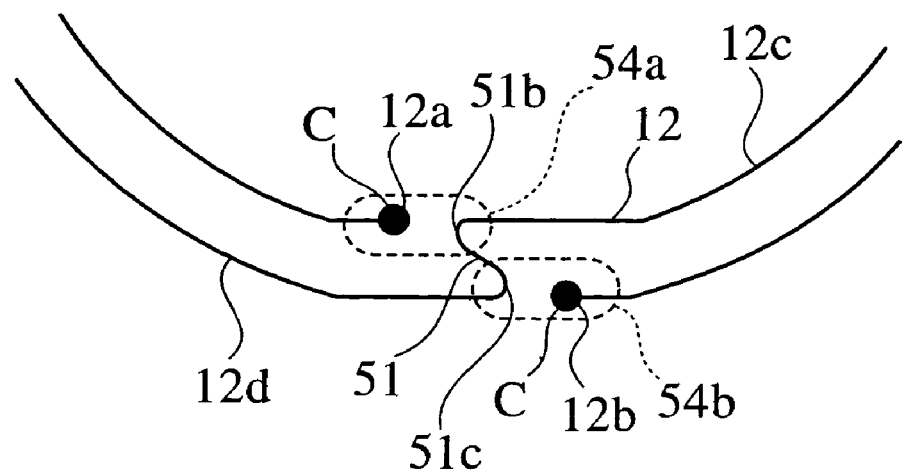
FIG. 13 is a partial plan view of the heater, showing another design example of the flexure of the resistant heater element according to the second embodiment.

FIG. 12 shows element patterns in and around the flexures. Here, the adjacent portion of the element line is, in FIG. 12, a flexure 52 of another element line 13, which is adjacent to a flexure 51 of the element line 12. In FIG. 13, the adjacent portion of the element line is terminal connection parts C and C connected to the terminals 12a and 12b of the same element line 12 adjacent to the flexure 51 of the element line 12.

FIG. 12 is a partially enlarged view of the element lines 12 and 13 according to the second embodiment. The element line 12 has the terminals 12a and 12b at its both ends and the element line 13 has the terminals 13a and 13b at its both ends. The element line 12 includes an inner arc part 12c and an outer arc part 12d, and these arc parts 12c and 12d are connected to each other by use of the flexure 51 which is provided between the terminals 12a and 12b. Similarly, in the element line 13, an inner arc part 13c and an outer arc part 13d are connected to each other by use of the flexure 52 which is provided between the terminals 13a and 13b.

In the respective flexures 51 and 52, formed are swollen parts 51a and 52a which are asymptotic to each other so as to narrow a space between the adjacent flexures 51 and 52.

Accordingly, the flexures 51 and 52 are adjacent to each other in the diameter direction and lengths thereof are set to be larger than a space between the corresponding arc parts. For example, a length L6 of the flexure 51 in the element line 12 is set to be larger than a space L7 between the inner and outer arc parts 12c and 12d of the element line 12 (L6>L7). Similarly, in the element line 13, the length of the flexure 52 is set to be larger than a space between the inner and outer arc parts 13c and 13d.

By setting the length of the flexures as described above, heat is generated while the adjacent flexures 51 and 52 are close to each other. Thus, a space between these flexures never becomes a cool spot. Consequently, the thermal uniformity of the entire plate 32 can be improved.

FIG. 13 shows a modified example according to the second embodiment. The element line 12 includes the terminal connection parts C and C connected to the terminals 12a and 12b at its both ends and the inner and outer arc parts 12c and 12d. These arc parts 12c and 12d are connected by use of the flexure 51 which is provided between the terminals 12a and 12b.

In the flexure 51, swollen parts 51b and 51c asymptotic to the terminal connection parts C and C are formed so as to narrow a space between the swollen parts and the adjacent terminal connection parts.

According to the above setting, heat is generated while one of the adjacent terminal connection parts C and the swollen part 51b are close to each other and the other terminal connection part C and the swollen part 51c are close to each other. Consequently, spaces 54a and 54b therebetween never become cool spots. Thus, the thermal uniformity of the entire plate can be improved.

EXAMPLE

By use of aluminum nitride as a material, the disk-shaped plate 32 shown in FIG. 6A was manufactured by using a hot-press method. The diameter of the plate 32 is 250 mm and the thickness thereof was 10 mm. In the plate 32, three through-holes 34 for a lift pin are provided at even intervals in a circumferential direction. Moreover, in molding, a coil-shaped resistant heater element 33 made of molybdenum was embedded in the plate.

In the resistant heater element 33, as shown in FIG. 10, the avoidance parts 45 and 46 having the radii of curvature R1 and R2, respectively, were formed around the through-holes 34. Herein, R1 was 9 mm and R2 was 18 mm. Moreover, the width L4 of the folding part 39 in the wiring pattern shown in FIG. 7 was 18 mm and the width L3 before and after the folding part was 15 mm. Note that the folding part 39 was formed in a curved shape.

Comparative Example

Figure 3:
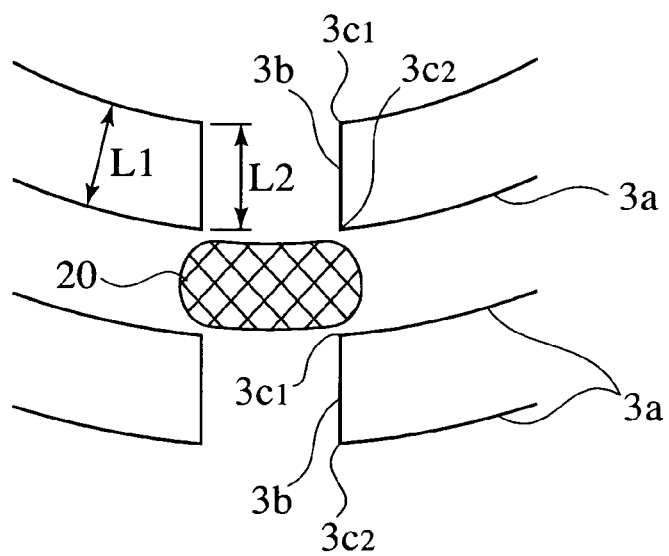
FIG. 3 is a partial plan view of a heater, showing a folding part of another conventional resistant heater element.
Figure 4:
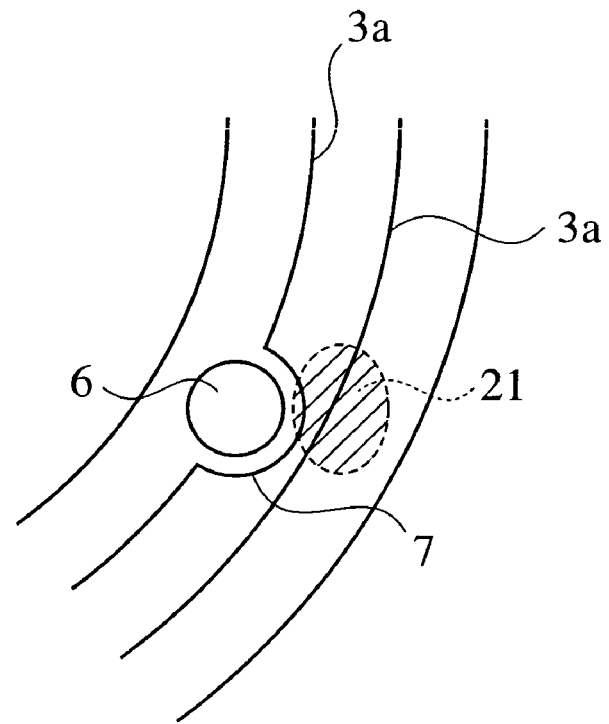
FIG. 4 is a partial plan view showing a periphery of a through-hole in the conventional heater.

A plate was manufactured by use of the same materials and sizes as those used in the example, the plate having similar through-holes provided therein. In this plate, a resistant heater element made of the same material as that of the example was embedded. In this resistant heater element, no avoidance part was formed around the through-holes and the small arc part 7 having a radius of curvature of 9 mm was formed as shown in FIG. 4. Moreover, as shown in FIG. 3, both of the width L2 of the folding part in the wiring pattern and the width L1 before and after the folding part were set to 15 mm. Note that the folding part was not formed in a swollen shape and/or a curved shape but was folded at a sharp angle.

Result

The heaters of the example and the comparative example were heated to 400° C. by use of electric power supplied thereto and the temperature was retained. In this state, the cool spot 20 shown in FIG. 3 occurs around the folding parts and the hot spot 21 shown in FIG. 4 occurred around the through-holes in the comparative example. Consequently, a result is obtained that the thermal uniformity of the entire plate in the comparative example is worse than that of the example by 5° C.

Furthermore, in the case of heating the heaters of the example and the comparative example to 700° C. and retaining the heaters in this state, a result is obtained that the thermal uniformity of the comparative example was worse than that of the example by 10° C. Thus, it is found out that the example includes better thermal uniformity than the comparative example.

Although the present invention has been described above by reference to certain embodiments, the represent invention is not limited to the embodiments described above. Modifications and variations of the embodiments described above will occur to those skilled in the art, in light of the above teachings.

What is claimed is:

1. A heater comprising:
a plate including a heating surface which heats an object to be heated; and
a resistance heater element provided in said plate, said resistance heater element comprising a continuous wiring pattern including a plurality of flexures, and a uniform thermal pattern portion, wherein an area between immediately radially adjacent outer corners of immediately radially adjacent flexures is varied to improve thermal uniformity between said adjacent flexures.

2. A heater comprising:
a plate including a heating surface for heating an object to be heated; and
a resistance heater element provided in said plate, said resistance heater element comprising a continuous wiring pattern including a plurality of radially sequential wirings having a plurality of radially adjacent folding parts, said folding parts having substantially rounded outer corners and a substantially straight connection portion connecting said substantially rounded outer corners of said folding parts;

wherein a first distance between a portion of one of said wirings before said wiring is folded to form one of said folding parts and an opposed, immediately radially adjacent portion of said wiring after said wiring is folded to form said folding part is substantially constant, and wherein a second distance between a portion of said wiring at one end of said folding part and an opposed, immediately radially adjacent portion of said wiring at the other end of said folding part is greater than said first distance.

3. The heater according to claim 2, wherein said second distance gradually increases toward said folding part.

4. The heater according to claim 2, wherein said wiring pattern further comprises two terminals disposed in a center of said plate and a plurality of arc wiring portions that are concentrically disposed axisymmetric to a center line of said plate.

5. The heater according to claim 2, wherein said resistance heater element is embedded in said plate.

6. The heater according to claim 2, wherein said plate comprises a ceramic.

7. The heater according to claim 6, wherein said ceramic is aluminum nitride.

8. A heater comprising:

a plate including a heating surface for heating an object to be heated; and a resistance heater element provided in said plate, said resistance heater element comprising a continuous wiring pattern including a plurality of radially sequential wirings having a plurality of radially adjacent folding parts, said folding parts including a substantially linear connection part and outer corners provided at both ends of said linear connection part;

wherein at least one of said outer corners of said folding parts is substantially rounded and swollen to protrude outwardly; and wherein a first distance between said radially sequential wirings in a first region of said wiring pattern other than a second region of said wiring pattern proximate said folding parts is substantially constant, and wherein a second distance between said radially sequential wirings in said second region is greater than said first distance.

9. A heater comprising:

a plate including a heating surface which heats an object to be heated; and a resistance heater element provided in said plate, said resistance heater element comprising a wiring pattern including a plurality of concentrically disposed element lines having terminals for input/output of electric power, each said element line including a winding pattern;

wherein at least one said element line passes between said terminals by means of a flexure; and wherein said flexure includes a swollen portion having substantially rounded outer corners that curves in an asymptotic direction with respect to at least one of an adjacent portion of said at least one element line and an adjacent portion of another immediately adjacent element line.

10. The heater according to claim 9, wherein said adjacent portion of said another immediately adjacent element line is a flexure of said another immediately adjacent element line.

11. The heater according to claim 9, wherein said adjacent portion of said at least one element line is a terminal end of a connection part of said at least one element line.

12. The heater according to claim 9, wherein said resistance heater element is embedded in said plate.

13. The heater according to claim 9, wherein said plate comprises a ceramic.

14. The heater according to claim 13, wherein said ceramic is aluminum nitride.

* * * * *